(12) United States Patent
Das et al.

(10) Patent No.: US 9,147,605 B2
(45) Date of Patent: Sep. 29, 2015

(54) THIN FILM DEVICES AND LOW TEMPERATURE PROCESS TO MAKE THIN FILM DEVICES

(71) Applicants: Sayantan Das, Tempe, AZ (US); Terry Alford, Tempe, AZ (US)

(72) Inventors: Sayantan Das, Tempe, AZ (US); Terry Alford, Tempe, AZ (US)

(73) Assignee: Arizona Board of Regents on Behalf of Arizona State University, Scottsdale, AZ (US)

(*) Notice: Subject to any disclaimer, the term of this patent is extended or adjusted under 35 U.S.C. 154(b) by 0 days.

(21) Appl. No.: 14/303,063

(22) Filed: Jun. 12, 2014

(65) Prior Publication Data

US 2014/0367858 A1 Dec. 18, 2014

Related U.S. Application Data

(60) Provisional application No. 61/835,054, filed on Jun. 14, 2013.

(51) Int. Cl.
| | |
|---|---|
| *H01L 23/52* | (2006.01) |
| *H01L 23/48* | (2006.01) |
| *H01L 21/44* | (2006.01) |
| *H01L 21/768* | (2006.01) |
| *H01L 23/482* | (2006.01) |
| *H01L 23/532* | (2006.01) |

(52) U.S. Cl.
CPC ...... *H01L 21/76886* (2013.01); *H01L 23/4827* (2013.01); *H01L 23/53233* (2013.01); *H01L 23/53271* (2013.01)

(58) Field of Classification Search
CPC .................... H01L 23/53228; H01L 21/76886

USPC .......................................... 257/762; 438/663
See application file for complete search history.

(56) References Cited

U.S. PATENT DOCUMENTS

| | | | |
|---|---|---|---|
| 5,288,456 A | 2/1994 | Aboelfotoh et al. | |
| 5,855,993 A | * 1/1999 | Brady et al. | .................. 428/209 |
| 6,046,108 A | * 4/2000 | Liu et al. | ...................... 438/687 |
| 6,183,689 B1 | 2/2001 | Roy et al. | |
| 6,821,890 B2 | 11/2004 | McGahay et al. | |
| 2009/0134521 A1 | 5/2009 | Liu et al. | |

FOREIGN PATENT DOCUMENTS

EP  0472804 B1  7/1997

OTHER PUBLICATIONS

Aboelfotoh, et al., Novel Low-Resistance Ohmic Contact to n-type GaAs Using Cu3Ge, Appl. Phys. Lett., 1994, 65 (25):3245-3247.
Blobaum, et al., Sputter-Deposition and Characterization of Paramelaconite, J. Mater. Res., 2003, 18(7):1535-1542.
Borek, et al., Low Resistivity Copper Germanide on (100) Si for Contacts and Interconnections, Appl. Phys. Lett., 1996, 69(23):3560-3562.

(Continued)

*Primary Examiner* — Luan C Thai
(74) *Attorney, Agent, or Firm* — Quarles & Brady LLP

(57) ABSTRACT

A method for preparing a device having a film on a substrate is disclosed. In the method, a film is deposited on a substrate. The film includes a first and a second metal. The first and the second metals in the film are converted to an intermetallic compound using microwave radiation. One example device prepared by the method includes a silicon substrate and a film on the substrate, wherein the film includes semiconducting copper germanide as the intermetallic compound.

22 Claims, 3 Drawing Sheets

(56) References Cited

OTHER PUBLICATIONS

Caspi, et al., Pressure Effect on the Magnetic and Crystallographic Structures in the U(Ni1_xCux)2Ge2 System, Journal of Alloys and Compounds, 1998, 271-273:378-381.

Das, et al., Microwave Assisted Low Temperature Encapsulation of Ag Films by Cu Reactions Using Ag—Cu Alloy Structures, Materials Letters, 2012, 89:163-165.

Dhar, et al., Room-Temperature Synthesis of Copper Germanide Phase by Ion Beam Mixing, Appl., Phys., Lett., 1995, 67(12):1700-1702.

Erofeev, et al., A Gold Free Fully Cu/Ge Metalized GaAs pHEMT for the High Frequency Applications, 2011 International Siberian Conference on Control and Communications SIBCON, pp. 261-264.

Gaudet, et al., Thin Film Reaction of Transition Metals with Germanium, J. Vac. Sci. Technol. A, 2006, 24(3):474-485.

Her, et al., Phase Transformation and Crystallization Kinetics of a-Ge/Cu Bilayer for Blue-Ray Recording Under Thermal Annealing and Pulsed Laser Irradiation, J. Appl. Phys., 2012, 111:043503-1-043503-6.

Joi, et al., Pulse Plating of Copper Germanide, Appl. Phys. Lett., 2013, 102:134107-1-134107-4.

Krusin-Elbaum, et al., Unusually Low Resistivity of Copper Germanide Thin Films Formed at Low Temperatures, Appl. Phys. Lett., 1991, 58(12):1341-1343.

Kumar, et al., LaNiO3 and Cu3Ge Contacts to YBa2Cu3O7-x Films, Journal of Electronic Materials, 1996, 25(11)1760-1766.

Lee, et al., Copper Oxide Reduction Through Vacuum Annealing, Applied Surface Science, 2003, 206:102-109.

Liou, et al., Oxidation of Cu and Cu3Ge Thin Films, J. Appl. Phys., 1995, 77(10):5443-5445.

Morgan, et al., Synthesis of Paramelaconite: Cu4O3, Journal of Solid State Chemistry, 1996, 121:33-37.

Peter, et al., Selective Chemical Vapor Synthesis of Cu3Ge: Process Optimization and Film Properties, Intermetallics, 2013, 34:35-42.

Wang, et al., Formation of Aluminum Oxynitride Diffusion Barriers for Ag Metallization, Appl. Phys. Lett., 1999, 74(1):52-54.

\* cited by examiner

THIN FILM DEVICES AND LOW TEMPERATURE PROCESS TO MAKE THIN FILM DEVICES

CROSS-REFERENCES TO RELATED APPLICATIONS

This application claims the benefit of U.S. Patent Application No. 61/835,054, filed on Jun. 14, 2013, which is incorporated herein by reference for all purposes.

STATEMENT REGARDING FEDERALLY SPONSORED RESEARCH

Not Applicable.

BACKGROUND OF THE INVENTION

1. Field of the Invention

The invention relates to methods for forming a germanium-based intermetallic thin film on a substrate. Specifically, the invention relates to a low temperature process for making germanium-based intermetallic thin films on a substrate.

2. Description of the Related Art

Thermal annealing and laser annealing are two generally applied techniques in making semiconductor thin films. Both thermal and laser annealing techniques are, however, associated with certain problems and disadvantages. For example, as a high temperature process, rapid thermal annealing may cause undesired diffusion into the surrounding material. In a laser annealing technique, the spot size of the laser is generally small, thus it is required to move the laser to different spots to anneal the entire area. During this process, some parts are missed while some parts are annealed multiple times, forming a "pattern". These pattern effects may degrade the device performance. Although microwave (MW)-assisted synthesis is appealing as a much simpler, faster, extremely energy efficient and environmentally friendly process, the breadth of low temperature synthesis of alloy thin films using microwave radiation has not yet been explored.

In past two decades, copper germanide ($Cu_3Ge$) has received widespread interest in the field of microelectronics [A. P. Peter, L. Carbonell, M. Schaekers, C. Adelmann, J. Meersschaut, A. Franquet, O. Richard, H. Bender, T. Zsolt, and S. van Elshocht, Intermetallics 34, 35 (2013)]. The use of $Cu_3Ge$ as a potential candidate for interconnections and contacts in Si and GaAs technology is due to its low contact resistivity and high thermal stability [L. Krusin-Elbaum and M. O. Aboelfotoh, Appl. Phys. Lett. 58, 1341 (1991); M. O. Aboelfotoh, C. L. Lin, and J. M. Woodall, Appl. Phys. Lett. 65, 3245 (1994)]. Erofeev et al. investigated the DC and RF performance of the gold free and fully Cu—Ge metalized GaAs pHEMT for high frequency application [E. V. Erofeev, V. A. Kagadei, and A. I. Kazimirov, 2011 *International Siberian Conference on Control and Communications (SIBCON)*, Krasnoyarsk, Russia, 15-16 Sep. 2011, pp 261-264]. $Cu_3Ge$ is also a potential material for recording layers in write-once blue-ray discs [G. Guizetti, F. Marabelli, P. Pellegrino, A, Sassella, J Appl. Phys. 111, 043503 (2012)]. Furthermore, $Cu_3Ge$ is also a promising material for metallization of superconducting $YBa_2Cu_3O_7$-x films [D. Kumar, R. D. Vispute, O. Aboelfotoh, S. Oktyabrysky, K. Jagannadham, and J. Narayan, J Electron Mater., 25 1760 (1996)]. Traditionally, high temperature anneals greater than 400° C. in a vacuum environment are required to synthesize $Cu_3Ge$ thin films, preventing their use in plastic-based, light-weight, and flexible substrates for thin film transistors, solar cells and light emitting diodes. In addition, the high temperature synthesis makes it difficult to be introduced into the resist lift-off technique. These drawbacks led to the motivation of developing a new synthetic method that can overcome these problems and facilitate product formation.

Needed in the art is a low-temperature process for making semiconductor thin films, e.g., germanium-based intermetallic thin films.

SUMMARY OF THE INVENTION

In one aspect, the present invention provides a method for preparing a device having a film on a substrate. In the method, a film is deposited on a silicon substrate. The film includes at least one first metal and one second metal. The first and the second metals in the film are converted into an intermetallic compound using microwave radiation. Preferably, the intermetallic compound is a semiconducting compound.

In one embodiment of the first aspect, the first metal may be germanium and the second metal may be selected from the group consisting of iron, cobalt, nickel, palladium, platinum and copper. Preferably, the second metal is copper.

In another embodiment of the first aspect, the intermetallic compound is copper germanide. Preferably, copper germanide is $\epsilon_1$-$Cu_3Ge$ phase.

In another embodiment of the first aspect, the film of the intermetallic compound may be further encapsulated in a thin layer of metal oxide. The metal oxide thin layer may automatically form during microwave radiation. Preferably, the metal oxide is copper oxide.

In one embodiment, the film of the intermetallic compound has a thickness of 1 to 100 nanometers.

In one embodiment of the first aspect, the resulting film has the resistivity value in the range of 5-20 $\mu\Omega$-cm.

In one embodiment of the first aspect, the microwave radiation has a frequency of 1 to 5 GHz. Preferably, the microwave radiation is used for less than one minute. More preferably, a maximum temperature during microwave radiation is below 100° C.

In another aspect, the present invention also provides a device comprising a silicon substrate and a film on the substrate, wherein the film includes an intermetallic compound of metal germanide. In one embodiment, the metal in the metal germanide is selected from the group consisting of iron, cobalt, nickel, palladium, platinum and copper.

In one preferred embodiment of the second aspect, the metal germanide is copper germanide. More preferably, the copper germanide is encapsulated in a copper oxide layer and the copper oxide layer has a thickness of 1-100 nanometers.

In one embodiment, the film has a thickness of 20 to 50 nanometers. Preferably, the film is single-crystalline. More preferably, the film has the resistivity value in the range of 5-20 $\mu\Omega$-cm.

It is an advantage of the invention to provide an improved method for preparing a device having an intermetallic metal germanide compound on a silicon substrate. Low temperature and quicker processing methods of the invention result in a device with improved properties compared to a device prepared by using conventional annealing techniques.

It is another advantage of the invention to automatically form a metal oxide thin layer encapsulating the intermetallic compound layer from degradation, corrosion and diffusion.

It is still another advantage of the invention to provide an inexpensive, fast, energy efficient and environmental friendly process to grow a thin film of intermetallic compound.

These and other features, aspects, and advantages of the present invention will become better understood upon consideration of the following detailed description, drawings and appended claims.

DETAILED DESCRIPTION OF THE INVENTION

Figure 1:
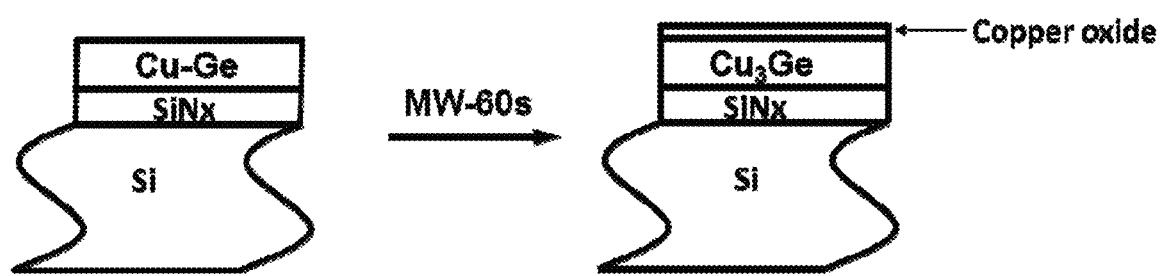
FIG. 1 is a diagram showing a schematic representation of $Cu_3Ge$ thin film grown inside a microwave oven.
Figure 2:
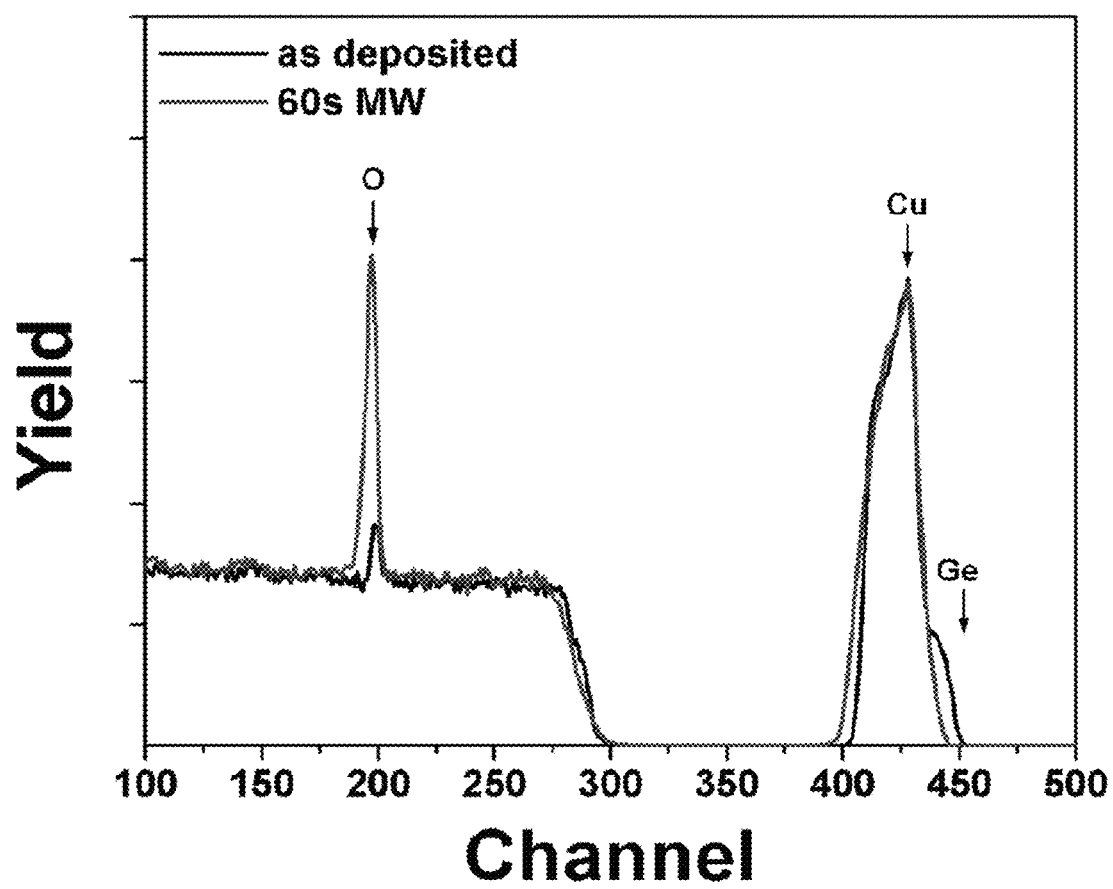
FIG. 2 is a diagram showing RBS spectra obtained from Cu—Ge thin films for as-deposited and microwave-processed samples.

The term "intermetallic," as used herein, refers to materials composed of two or more types of metal atoms, which exist as homogeneous, composite substances and differ discontinuously in structure from that of the constituent metals. They may also be called, preferably, intermetallic phases. Their properties cannot be transformed continuously into those of their constituents by changes of composition alone, and they form distinct crystalline species separated by phase boundaries from their metallic components and mixed crystals of these components. It is generally not possible to establish formulas for intermetallic compounds on the sole basis of analytical data. Therefore, formulas are determined in conjunction with crystallographic structural information.

There are differences between intermetallic compounds and alloys. Both are metallic phases containing more than one element. But in alloys, the various elements substitute randomly for one another in the crystal structure, forming a solid solution with a range of possible compositions. In intermetallic compounds, different elements are ordered into different sites in the structure, with distinct local environments and often a well-defined, fixed stoichiometry. Complex structures with very large unit cells may be formed.

Intermetallic compounds are generally brittle and have a high melting point. They often offer a compromise between ceramic and metallic properties when hardness and/or resistance to high temperatures is important enough to sacrifice some toughness and ease of processing. They may also display desirable magnetic, superconducting and chemical properties, due to their strong internal order and mixed (metallic and covalent/ionic) bonding, respectively. Intermetallics have given rise to various novel materials developments.

The term "annealing", as used herein, refers to a heat treatment that alters a material to increase its ductility and to make it more workable. It involves heating a material to above its critical temperature, maintaining a suitable temperature, and then cooling. Annealing can induce ductility, soften material, relieve internal stresses, refine the structure by making it homogeneous, and improve cold working properties. In one embodiment of the present invention, annealing also includes susceptor assisted microwave annealing. The samples to be annealed may be placed on a susceptor material. Susceptors may be described as materials that have dielectric properties that are suitable for microwave absorption. Non-limiting embodiments of susceptors comprise SiC, SiC coated alumina, MgO coated alumina, SiC coated quartz, and MgO coated quartz. Temperatures generated in the samples and annealing times may be affected by susceptor assisted microwave annealing. Other methods capable of capturing heat with or without susceptors and residing on and in a susceptor may be suitable for the present invention.

For example, a result of ion implantation is the presence of damage deposited into a substrate's surface layer and increased sheet resistance. Typically thermal anneals are done to activate implanted dopants and to repair the damage created during the ion implantation. During high temperature processing, significant diffusion of dopant atoms can occur due to uneven or prolonged heating. To lessen the extent of dopant diffusion during heating, rapid thermal processing (RTP) is typically used to activate dopants [J. D. Plummer, M. D. Deal, P. B. Griffin, Silicon VLSI Technology: Fundamentals, Practice and Modeling, Prentice Hall, Upper Saddle River, N.J. (2000)]. These processes result in nonuniform heating due to emissivity differences [J. D. Plummer, M. D. Deal, P. B. Griffin, Silicon VLSI Technology: Fundamentals, Practice and Modeling, Prentice Hall, Upper Saddle River, N.J. (2000); A. V. Rzhanov, N. N. Gerasimenko, S. V. Vasil'ev, and V. I. Obodnikov, Sov. Tech. Phys. Lett. 7, 521 (1981)].

Alford et al. have shown that single frequency microwaves repair radiation damage and As ion activation at temperatures as low as <700 C. Another approach is to scan the frequencies over a short intervals (e.g., 0.1 seconds); this is believed to minimize anti-nodes and nodes associated with fixed frequency microwaves.

In one aspect, the present invention relates to a method or process for making a device having a film on a substrate. In a typical method or process, a substrate is initially provided. Any suitable substrates as appreciated by one skilled in the art may be used for the present invention. In one preferred embodiment, the substrate is silicon, more preferably, silicon wafers. Applicants envision that the present low temperature process may allow a thin film device to form on polymer substrates. The suitable polymer substrates may comprise a polymeric material selected from the group consisting of polyethylene napthalate (PEN), polyethylene terephthalate, polyethersulphone, polyarylate, polyimide, and mixtures thereof. Preferably, the polymeric substrate of the device may comprise polyethylene napthalate. The polymeric substrate of the device may be flexible.

In one embodiment, the substrate may be Gallium Arsenide (GaAs). More generally, the present invention may be applicable to the formation of a material on substrates including group IV substrates, such as silicon and germanium, silicon-on-insulator (SOI) substrates, compound semiconductor substrates from group III-V including binaries such as GaAs, InP, or GaSb.

In one embodiment, the substrate may be a semiconductor compound that includes at least one group III element (e.g., Ga, In, Al) and at least one group V element (e.g., P, As, Sb). In one embodiment, the substrate may be a semiconductor compound that includes at least one group II element (e.g., Te) and at least one group VI element (e.g., Cd).

In one embodiment, the present invention may be applicable to substrates upon which display devices may be fabricated, such as glass materials, or even materials such as PEN that are used for flexible electronics and displays, where low-temperature performance in processing may be desirable. In one preferred embodiment, the substrate is GaAs.

After the substrate is provided, a film comprising at least a first and a second metal is deposited on the substrate. Any semiconductor metals may be suitable for the first metal. In one preferred embodiment, the first metal is germanium. Any suitable metals as appreciated by one skilled in the art may be used as the second metal. In one preferred embodiment, the second metal may be any metal capable of forming an intermetallic compound with the first metal. More preferably, the second metal is selected from the group consisting of iron, cobalt, nickel, palladium, platinum and copper. Most preferably, the second metal is copper.

Co-sputtering of the first and the second metals is one suitable technique for depositing the first and the second metals on the substrate; however, other deposition processes, e.g., electrodeposition, sol-gel, spray may also be suitable. The film of the first and the second metals may have various thicknesses, such as 1 to 1000 nanometers, or 1 to 300 nanometers, or 1 to 100 nanometers, or 1 to 50 nanometers, or 1 to 30 nanometers, or 10 to 30 nanometers. In one embodiment of the present invention, the deposition process of the first and the second metals may be conducted under an air-tight condition. In one preferred embodiment, the air-tight condition may be pure argon gas purge.

After the deposition of the film comprising at least a first and a second metals on the substrate, the first and the second metals in the film are converted into an intermetallic compound using microwave radiation. In one embodiment of the present invention, microwave radiation may be conducted under an air ambient condition.

In another embodiment of the present invention, microwave radiation may be conducted under an air-tight condition. An exemplary microwave may include the one described in http://dsgtek.com/. A controllable amount of gas, e.g., oxygen, nitrogen, or argon, may be introduced into the system. For example, a controllable amount of oxygen may be added into the air-tight system to form a metal oxide protection layer over the intermetallic film. Any method for controlling the amount of gas as appreciated by one skilled in the art may be suitable for the present invention.

In one embodiment, the controllable amount of gas may be introduced from a gas cabinet. In one embodiment, the controllable amount of gas may be introduced through a Digital Mass Flow Controller. In one embodiment, the controllable amount of gas may be introduced to a feed through. In one embodiment, the controllable amount of gas may be introduced into the chamber.

In one embodiment, the controllable amount of gas may travel through specific parts of the system. For example, gas may travel from the gas cabinet, through a Digital Mass Flow Controller, to a feed-through, and into the chamber.

Before converting the first and second metals in the film to an intermetallic compound using microwave radiation, the film may be amorphous or other non-intermetallic forms. After converting the first and the second metals in the film into an intermetallic compound using microwave radiation, the film may be single-crystalline. In one embodiment, the intermetallic compound is a semiconducting compound. In one preferred embodiment, the intermetallic compound is copper germanide ($Cu_3Ge$). More preferably, copper germanide has an orthorhombic $\epsilon_1$-$Cu_3Ge$ phase.

The film of the resulting intermetallic compound may have various thicknesses, such as 1 to 1000 nanometers, or 1 to 300 nanometers, or 1 to 100 nanometers, or 1 to 50 nanometers, or 1 to 30 nanometers, or 10 to 30 nanometers.

In one version of the method, the first and the second metals that are deposited on the film may be converted to an intermetallic compound by using microwave radiation having a frequency of 0.3 to 300 GHz, or 1 to 100 GHz, or 1 to 50 GHz, or 1 to 25 GHz, or 1 to 10 GHz, or 1 to 5 GHz. In another version of the method, the first and the second metals that are deposited on the film may be converted to an intermetallic compound by using microwave radiation applied for less than ten minutes, or less than five minutes, or less than one minute.

Preferably, a maximum temperature reached during application of the microwave radiation is below 150° C., or below 100° C., or below 50° C.

In one embodiment of the present invention, the resulting film of the intermetallic compound may be encapsulated in a thin layer of metal oxide, which protects the intermetallic compound film from degradation, e.g., further oxidation, corrosion and/or diffusion. In another embodiment, the thin layer of the metal oxide automatically forms during microwave radiation. In another embodiment, Applicants envision that the thickness of the metal oxide thin layer may be controllable. For example, the intermetallic compound film may form during microwave radiation under an air-tight condition. A controllable amount of oxygen may be added into the system to form a metal oxide thin layer with a controllable thickness. Alternatively, the thickness of the metal oxide thin layer may be controllable by varying the duration of microwave radiation. For example, increasing microwave annealing time may lead to the growth of a thicker copper oxide layer.

In one preferred embodiment, the metal oxide is copper oxide and the copper oxide can be $CuO$, or $Cu_4O_3$, or $Cu_2O$. Preferably, copper oxide is semiconducting.

In one embodiment, the thin layer of copper oxide may have various thicknesses, such as 1 to 100 nanometers, or 1 to 50 nanometers, or 1 to 30 nanometers, or 10 to 30 nanometers.

In one embodiment of the present invention, the film of the intermetallic compound encapsulated in a metal oxide thin layer may have a resistance value in the range of 5-20 μΩ-cm. In one preferred embodiment, a film of $Cu_3Ge$ encapsulated in $Cu_4O_3$ layer has the lowest resistivity values of 14 μΩ-cm.

In another aspect, the present invention relates to a device and the device may be made following the method or process as discussed above. In one embodiment, the device may comprise a substrate and a film on the substrate. In one preferred embodiment, the film may comprise a metal germanide. In one embodiment of the present invention, the metal in the metal germanide may be selected from the group consisting of iron, cobalt, nickel, palladium, platinum and copper. Most preferably, the second metal is copper.

The film of the device may have various thicknesses, such as 1 to 1000 nanometers, or 1 to 300 nanometers, or 1 to 100 nanometers, or 1 to 50 nanometers, or 1 to 30 nanometers, or 10 to 30 nanometers. The film of the device may be single-crystalline. In one preferred embodiment, the film of the device may be an intermetallic compound of metal germanide. More preferably, the film of the device may be an intermetallic compound of copper germanide ($Cu_3Ge$). More preferably, the intermetallic compound of copper germanide has an orthorhombic $\epsilon_1$-$Cu_3Ge$ phase.

In one embodiment of the present device, the film of the intermetallic compound may be encapsulated in a thin layer of metal oxide, which protects the intermetallic compound film from degradation, e.g., further oxidation, corrosion and diffusion. In one preferred embodiment, the metal oxide is copper oxide and the copper oxide in the thin layer may be $CuO$, or $Cu_4O_3$, or $Cu_2O$. Preferably, copper oxide in the thin layer is semiconducting.

In one embodiment, the thin layer of copper oxide may have various thicknesses, such as 1 to 100 nanometers, or 1 to 50 nanometers, or 1 to 30 nanometers, or 10 to 30 nanometers.

In one embodiment of the present device, the film of the intermetallic compound encapsulated in a metal oxide thin layer may have a resistance value in the range of 5-20 μΩ-cm. In one preferred embodiment of the present device, a film of $Cu_3Ge$ encapsulated in $Cu_4O_3$ layer has the lowest resistivity values of 14 μΩ-cm.

Traditionally, high temperature anneals greater than 400° C. in a vacuum environment are required to synthesize $Cu_3Ge$ thin films, preventing their use in plastic-based, light-weight, and flexible substrates for thin film transistors, solar cells and light emitting diodes.

Applicants envision that the thin film device of $Cu_3Ge$ formed by microwave annealing in the present invention represents a potential candidate material for contact and metallization in these applications including GaAs-based devices.

EXAMPLES

The following Examples are provided in order to demonstrate and further illustrate certain embodiments and aspects of the present invention and are not to be construed as limiting the scope of the invention.

Example 1

Experiments

In this method, thin films of Cu—Ge were deposited on Si wafers with 100 nanometers of $SiN_x$ by co-sputtering 99.99% Cu and Ge targets using 99.9% pure Ar gas at temperatures in the range ~30-40° C. followed by microwave (MW) annealing. Samples of 1 cm×1 cm were then cleaved from the wafers and placed inside a conventional microwave oven under an air ambient condition and annealed for various times. In one version of the method, the Cu and Ge that are deposited on the substrate is converted to $Cu_3Ge$ using microwave radiation having a frequency of 0.3 to 300 GHz, or 1 to 100 GHz, or 1 to 50 GHz, or 1 to 25 GHz, or 1 to 10 GHz, or 1 to 5 GHz. In one version of the method, Cu and Ge that are deposited on the substrate are converted to a $Cu_3Ge$ using microwave radiation, applied for less than ten minutes, or less than five minutes, or less than one minute. Preferably, a maximum temperature reached during the application of the microwave radiation is below 150° C., or below 100° C. The sample temperature was monitored using a Rayteck MID pyrometer. The structural properties of the as-deposited and annealed films were investigated by x-ray diffraction (XRD).

The thickness, composition and amount of mixing of the as deposited and microwave annealed samples were determined using Rutherford backscattering spectrometry (RBS) 3.05 MeV alpha particles and RUMP computer simulations [L. R. Doolittle, Nucl. Instr. and Meth. B9, 344 (1985)]. X-ray diffraction (XRD) using Cu Kα radiation was done to determine structural properties of the films. The electronic state and composition of the surface layer of the microwave annealed samples was studied by using X-ray photoelectron spectroscopy (XPS) with a radiation source of Al Kα (1487 eV).

Results and Discussion

The encapsulation of $Cu_3Ge$ by copper oxides makes it oxidation resistant and a smart material for copper metallization. After microwave annealing under an air ambient condition for 30 seconds, the surface color of $Cu_3Ge$ changes from a shiny metallic luster to deep blue color. This color change is indicative of mixed copper oxide phase formation. The excess copper reacts with ambient oxygen and forms a thin layer of copper oxides on the surface. A RBS spectrum of the microwave annealed samples is shown in FIG. 1. The RBS spectrum is compared with that of the as-deposited sample. FIG. 1 clearly shows the increase in intensity of the oxygen signal near channel number 200 after microwave annealing. After microwave annealing the copper signal near channel number 433 does not move indicating the growth of a copper oxide layer and not germanium oxide. RUMP simulation results show that the as-deposited Cu—Ge samples were ~80 nanometers thick. After 60 seconds of microwave annealing, the thickness of the copper germanide layer is measured as 56 nanometers with a typical composition of $Cu_{2.86}Ge$. The composition of the outer copper oxide layers was $CuO_{0.77}$ and the thickness of the layer was 42 nanometers. This composition corresponds to the paramelaconite ($Cu_4O_3$) structure. Increasing microwave annealing time led to the growth of a thicker copper oxide layer.

Figure 3:
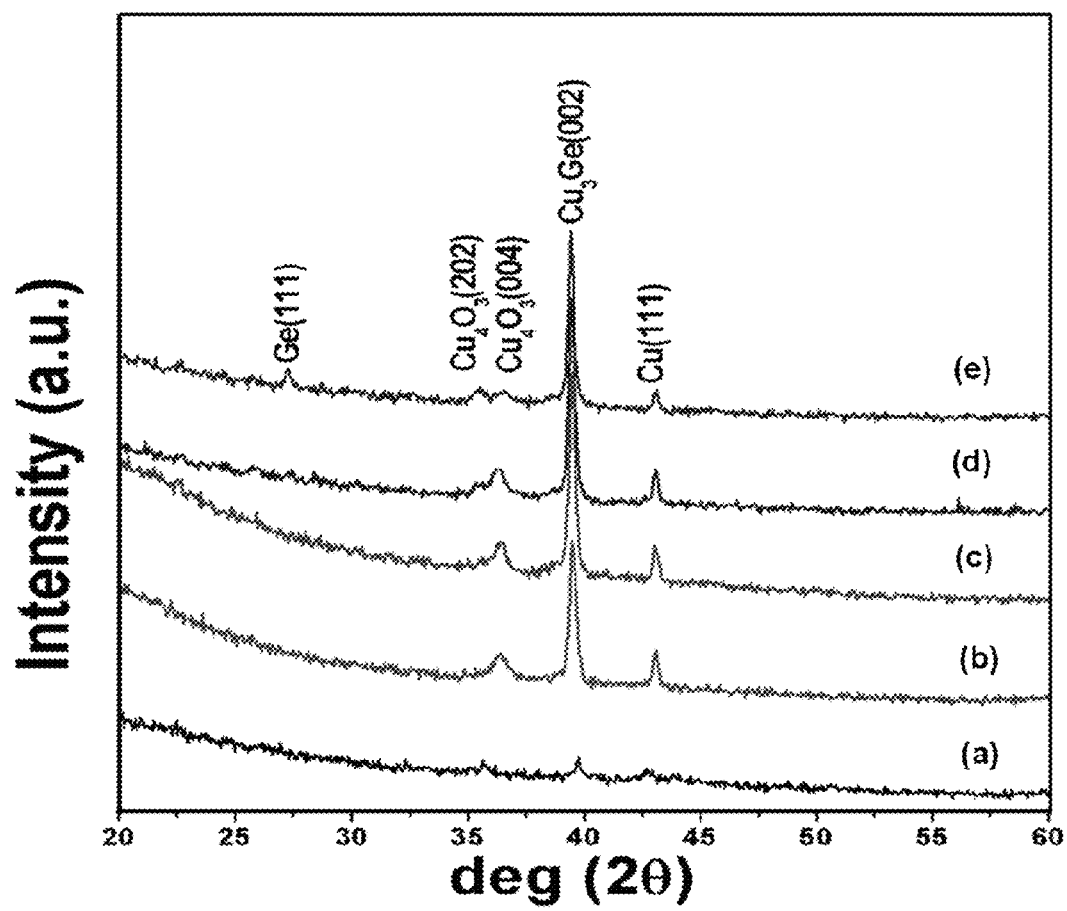
FIG. 3 is a diagram of XRD patterns showing (a) as deposited (b) after 30 seconds microwave annealed, (c) after 60 seconds microwave annealed (d) after 90 seconds microwave annealed and (e) after 120 seconds microwave annealed samples.

FIG. 3 shows XRD patterns regarding the structure of as-deposited and microwave annealed samples at various times. The JCPDS card 89-1150 was used to identify the phase of $Cu_3Ge$ [E. Caspi, H. Shaked, H. Pinto, M. Melamud, Z. Hu, O. Chmaissem, S. Short, and J. D. Jorgensen, J. Alloys Compds. 271, 378 (1998)]. The XRD patterns after different anneal times also suggests that the various reactions occurred during different stages of microwave annealing. The as-deposited sample showed no evidence of $Cu_3Ge$ formation. However, after 30 seconds of microwave annealing, the XRD pattern showed the strong (002) and a small (400) peak which are ascribed to orthorhombic $\epsilon_1$-$Cu_3Ge$ phase. Inspection also reveals the growth of crystalline Cu (111). The intensity of the $Cu_3Ge$ (002) peak increases after 60 seconds of microwave annealing which reveals better crystal growth of the $\epsilon_1$-$Cu_3Ge$ phase. A close look at the intensity of the $Cu_3Ge$ (002) peak reveals that the intensity saturates after 60 seconds of microwave annealing. Prolonged heating for 120 seconds leads to the decrease in intensity of the $Cu_3Ge$ (002) and growth of Ge (111) phase. Thus, the XRD analysis suggests that longer microwave annealing leads to degradation of $Cu_3Ge$ with formation of crystalline Ge.

Achievement of a low resistivity $Cu_3Ge$ layer is an important concern for the self-encapsulation process. Table 1 shows the resistivity of as deposited and microwave annealed Cu—Ge films at different times versus annealing temperatures. It is assumed that the room temperature resistivity obtained with the four-point probe analysis is due to the underlying $Cu_3Ge$ layer since the thin copper oxide layer will have a much higher resistance than the underlying $Cu_3Ge$ layer. The thickness of the underlying $Cu_3Ge$ layer is obtained from the simulation of RBS data. It is observed that the resistivity initially decreased until 60 seconds of microwave anneals due to the formation of low resistive $Cu_3Ge$ phase. However, it dramatically increases after 90 seconds anneals due to the formation of thicker copper oxide layers and segregation of crystalline Ge from the solid $Cu_3Ge$ phase.

In conclusion, copper germanide thin films are formed by a low temperature microwave process of Cu—Ge alloy films on silicon nitride substrates. During this process, the crystalline $\epsilon_1$-$Cu_3Ge$ phase is formed after short microwave annealing times. The $Cu_3Ge$ phase is further encapsulated by the paramelaconite phase of copper oxide which is formed during the microwave anneal process and its formation is confirmed by RBS and XRD data interpretation. The copper oxide layer can protect the underlying $Cu_3Ge$ from corrosion and diffusion. The microwave processed $Cu_3Ge$ films have the lowest resistivity values of 14 μΩ-cm obtained after annealing for 60 seconds. This short time, low temperature process has potential to enable the implementation of low resistivity metallization in future thin film transistors on flexible polymeric substrates.

TABLE I

Room-temperature resistivity of encapsulated Cu$_3$Ge films prepared by microwave (MW) annealing. The resistivity values are obtained from four-point probe and RBS thickness measurements.

| MW annealing time (s) | Resistivity (μΩ cm) |
|---|---|
| 0 | 67.7 |
| 30 | 20.1 |
| 60 | 13.7 |
| 90 | 21.3 |
| 120 | 28.5 |

Although the invention has been described in considerable detail with reference to certain embodiments, one skilled in the art will appreciate that the present invention can be practiced by other than the described embodiments, which have been presented for purposes of illustration and not of limitation. Therefore, the scope of the appended claims should not be limited to the description of the embodiments contained herein.

REFERENCES

[1] A. P. Peter, L. Carbonell, M. Schaekers, C. Adelmann, J. Meersschaut, A. Franquet, O. Richard, H. Bender, T. Zsolt, and S. van Elshocht, Intermetallics 34, 35 (2013).
[2] L. Krusin-Elbaum and M. O. Aboelfotoh, Appl. Phys. Lett. 58, 1341 (1991).
[3] M. O. Aboelfotoh, C. L. Lin, and J. M. Woodall, Appl. Phys. Lett. 65, 3245 (1994).
[4] E. V. Erofeev, V. A. Kagadei, and A. I. Kazimirov, 2011 *International Siberian Conference on Control and Communications (SIBCON)*, Krasnoyarsk, Russia, 15-16 Sep. 2011, pp 261-264.
[5] G. Guizetti, F. Marabelli, P. Pellegrino, A, Sassella, J Appl. Phys. 111, 043503 (2012).
[6] D. Kumar, R. D. Vispute, O. Aboelfotoh, S. Oktyabrysky, K. Jagannadham, and J. Narayan, J Electron Mater., 25 1760 (1996).
[7] L. R. Doolittle, Nucl. Instr. and Meth. B9, 344 (1985).
[8] E. Caspi, H. Shaked, H. Pinto, M. Melamud, Z. Hu, O. Chmaissem, S. Short, and J. D. Jorgensen, J. Alloys Compds. 271, 378 (1998).
[9] J. D. Plummer, M. D. Deal, P. B. Griffin, Silicon VLSI Technology: Fundamentals, Practice and Modeling, Prentice Hall, Upper Saddle River, N.J. (2000).
[10] A. V. Rzhanov, N. N. Gerasimenko, S. V. Vasil'ev, and V. I. Obodnikov, Sov. Tech. Phys. Lett. 7, 521 (1981).

What is claimed is:

1. A method for preparing a device having a film on a substrate, the method comprising:
   (a) providing a substrate;
   (b) depositing a film on the substrate, the film including a first metal and a second metal; and
   (c) converting the first and second metals in the film into an intermetallic compound using microwave radiation.

2. The method of claim 1 wherein:
   the substrate is selected from group IV substrates, silicon-on-insulator (SOI) substrates, and compound semiconductor substrates from group III-V.

3. The method of claim 1 wherein:
   the first metal is germanium.

4. The method of claim 1 wherein:
   the second metal is copper.

5. The method of claim 1 wherein:
   the intermetallic compound is copper germanide and copper germanide is $\epsilon_1$-Cu$_3$Ge phase.

6. The method of claim 5 wherein:
   copper germanide is encapsulated by a copper oxide layer.

7. The method of claim 6 wherein:
   the copper oxide layer has a thickness of 1-100 nanometers.

8. The method of claim 1 wherein:
   after step (c), the film has the resistivity value in the range of 5-20 μΩ-cm.

9. The method of claim 1 wherein:
   in step (c), the microwave radiation is used for less than one minute.

10. The method of claim 1 wherein:
    a maximum temperature during step (c) is below 100° C.

11. An device comprising:
    a substrate; and
    a film on the substrate, the film including a metal germanide,
    wherein the metal germanide is encapsulated in a metal oxide layer.

12. The device of claim 11 wherein:
    the substrate is selected from group IV substrates, silicon-on-insulator (SOI) substrates, and compound semiconductor substrates from group III-V.

13. The device of claim 11 wherein:
    the metal germanide is intermetallic.

14. The device of claim 11 wherein:
    the metal of the metal germanide is selected from the group consisting of iron, cobalt, nickel, palladium, platinum and copper.

15. The device of claim 11 wherein
    the metal germanide is copper germanide.

16. The device of claim 15 wherein:
    the copper germanide is encapsulated in a copper oxide layer.

17. The device of claim 16 wherein:
    the copper oxide layer has a thickness of 1-100 nanometers.

18. The device of claim 11 wherein:
    the film has a thickness of 20 to 50 nanometers.

19. The device of claim 11 wherein the film is single-crystalline.

20. The device of claim 11 wherein:
    the film has the resistivity value in the range of 5-20 μΩ-cm.

21. The method of claim 1 wherein:
    the substrate comprises a polymeric material selected from the group consisting of polyethylene napthalate, polyethylene terephthalate, polyethersulphone, polyarylate, polyimide, and mixtures thereof.

22. The device of claim 11 wherein:
    the substrate comprises a polymeric material selected from the group consisting of polyethylene napthalate, polyethylene terephthalate, polyethersulphone, polyarylate, polyimide, and mixtures thereof.

* * * * *